United States Patent [19]
Hikita et al.

[11] Patent Number: 5,235,234
[45] Date of Patent: * Aug. 10, 1993

[54] SURFACE ACOUSTIC WAVE DEVICE

[75] Inventors: Mitsutaka Hikita, Hachioji; Toyoji Tabuchi, Tsukui; Nobuhiko Shibagaki, Kokubunji; Atsushi Isobe, Kodaira; Kazuhito Kurosawa, Nakaminato, all of Japan

[73] Assignee: Hitachi, Ltd., Tokyo, Japan

[ * ] Notice: The portion of the term of this patent subsequent to Nov. 12, 2008 has been disclaimed.

[21] Appl. No.: 785,524

[22] Filed: Oct. 31, 1991

Related U.S. Application Data

[63] Continuation of Ser. No. 526,508, May 21, 1990, Pat. No. 5,065,065.

[51] Int. Cl.$^5$ .............................................. H01L 41/08
[52] U.S. Cl. .............................. 310/313 B; 310/313 C
[58] Field of Search ........... 310/313 A, 313 B, 313 C; 333/196

[56] References Cited

U.S. PATENT DOCUMENTS

| | | | |
|---|---|---|---|
| 4,422,000 | 12/1983 | Yamada et al. | 310/313 D |
| 4,659,955 | 4/1987 | Schofield | 310/313 D |
| 4,736,172 | 4/1988 | Ebneter | 333/193 |
| 4,737,790 | 3/1986 | Skeie et al. | |
| 4,866,325 | 12/1989 | Kodama et al. | |
| 4,939,487 | 7/1990 | Yuhara et al. | 333/193 |
| 4,947,073 | 8/1990 | Stokes et al. | 310/313 R |
| 5,065,065 | 11/1991 | Hikita et al. | 310/313 B |

FOREIGN PATENT DOCUMENTS

| | | |
|---|---|---|
| 0026114 | 4/1981 | European Pat. Off. . |
| 58-36012 | 8/1981 | Japan . |
| 59-214315 | 12/1984 | Japan . |
| 60-145716 | 1/1985 | Japan . |
| 63-173412 | 7/1988 | Japan . |
| 63-250908 | 10/1988 | Japan . |
| 63-194406 | 11/1988 | Japan . |

OTHER PUBLICATIONS

Mitsutaka Hikita, et al., "800-MHz High-Performance SAW Filter Using New Resonant Configuration", IEEE Transactions of Microwave Theory and Techniques, vol. MIT-33, No. 6, Jun. 1985, pp. 510-518.

Kazuhiko Yamanouchi, et al., "Propagation and Amplification of Rayleigh Waves and Piezoelectric Leaky Surface Waves in LiNbO$_3$", Journal of Applied Physics, vol. 43, No. 3, Mar. 1972, pp. 856-862.

*Primary Examiner*—Steven L. Stephan
*Assistant Examiner*—Thomas M. Dougherty
*Attorney, Agent, or Firm*—Fay, Sharpe, Beall, Fagan, Minnich & McKee

[57] ABSTRACT

A surface acoustic wave device comprises a piezoelectric substrate and a plurality of electrode fingers which are located on the piezoelectric substrate along the propagation direction of a surface acoustic wave. The electrode fingers are located on the piezoelectric substrate at a pitch of about 1.5λo/2 (where a symbol λo indicates a wavelength of a surface acoustic wave with a frequency equivalent to the center frequency of the surface acoustic wave device). The width of each of the electrode fingers is about 1.5λo/4. The electrode fingers are located on the substrate so as to be electrically independent of an external circuit and each other.

Since the width of electrode fingers is about 1.5λo/4, the surface acoustic wave device can be produced without fine processing techniques.

26 Claims, 4 Drawing Sheets

SURFACE ACOUSTIC WAVE DEVICE

This case is a continuation of Ser. No. 526,508, now U.S. Pat. No. 5,065,065.

BACKGROUND OF THE INVENTION

The present invention relates to a surface acoustic wave device which is suited, for example, to a transceiver or a transmitter and a receiver for mobile communications such as cellular radio.

A conventional surface acoustic wave filter comprises an input or output interdigital transducer mounted on a piezoelectric substrate for converting an electric signal to a surface acoustic wave or a surface acoustic wave to an electric signal and an intermediate interdigital transducer for connecting inputs when necessary. Such a surface acoustic wave filter is described, for example, in IEEE Transactions on Microwave Theory and Techniques, Vol. MTT-33, No. 6, pp. 510–518, June 1985.

In the prior art, assuming that a wavelength of a surface acoustic wave propagating at a frequency equivalent to the center frequency (frequency at the center of the pass band) of the filter is λo, width of each of interdigital electrode fingers is about ¼ of the wavelength or λo/4. The value of λo is proportional to the reciprocal of the center frequency of the surface acoustic wave filter; that is, the value of λo decreases as the frequency increases. When the frequency is 1 GHz, for example, the value of λo is about 5 μm, and the electrode finger width becomes 1.0 to 1.25 μm.

SUMMARY OF THE INVENTION

There has been a request for a high frequency surface acoustic wave filter of 1 GHz or higher in mobile and optical communications. However, the prior art does not consider productivity of such high frequency surface acoustic wave filters. Because the electrode finger width of λo/4 becomes submicrons for frequencies of 1 GHz or higher, a very fine process technic is required which decreases productivity.

Figure 3A:
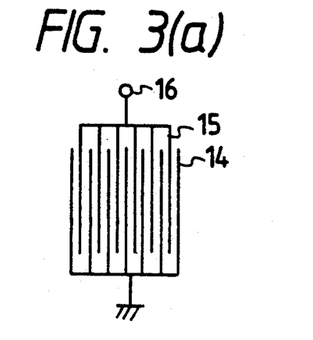
FIGS. 3(a) and 3(b) are a plan view and a sectional view for showing the layout of electrode fingers of a transducer of the prior art.
Figure 3B:
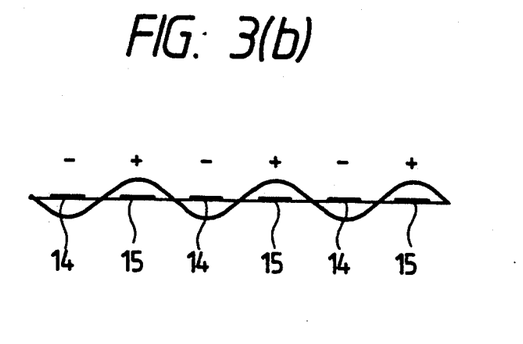

A transducer of the prior art, as shown in FIG. 3(a), excites or receives a surface acoustic wave by electrode fingers 14 and 15 which are alternately applied with a positive and a negative voltage. As shown in the sectional view in FIG. 3(b), electrode fingers 15 and 14 of the transducer exist at the peaks and bottoms of the oscillation generated by the surface acoustic wave, and the electrode fingers are applied with a positive or negative voltage or a negative or positive voltage in correspondence with each peak or bottom. As shown in FIG. 3(b), the electrode finger width of a transducer of the prior art is generally about a quarter of the wavelength.

The propagation speed of a surface acoustic wave is generally 4,000 to 5,000 m/s though it varies with a piezoelectric substrate. Therefore, the electrode finger width of a transducer is 1.0 to 1.25 μm in a frequency band of about 1 GHz.

In recent mobile or optical communications, frequencies of about 1 GHz are often used. In the near future, higher frequencies will be required.

A surface acoustic wave device is possibly necessary for miniaturization of mobile communications and for performance of optical communications functions such as timing extraction. Use of high frequencies requires a very fine processing technic for forming minute surface acoustic wave devices. A surface acoustic wave device of a frequency band of 2 GHz, for example, requires an electrode finger width of 0.5 to 0.6 μm. The production of such fine fingers is near the limits of the current processing. Although it is possible to form devices for higher frequencies, the yield rate is extremely low.

An object of the present invention is to provide a surface acoustic wave device for high frequencies which can be produced without a very fine processing technic.

The above object is accomplished by the present invention which provides a surface acoustic wave device comprising a piezoelectric substrate for propagating a surface acoustic wave and a plurality of electrode fingers mounted on the substrate along the wave propagation direction where the electrode fingers are electrically independent of the external circuit of every other finger.

DETAILED DESCRIPTION OF THE EMBODIMENTS

Figure 1:
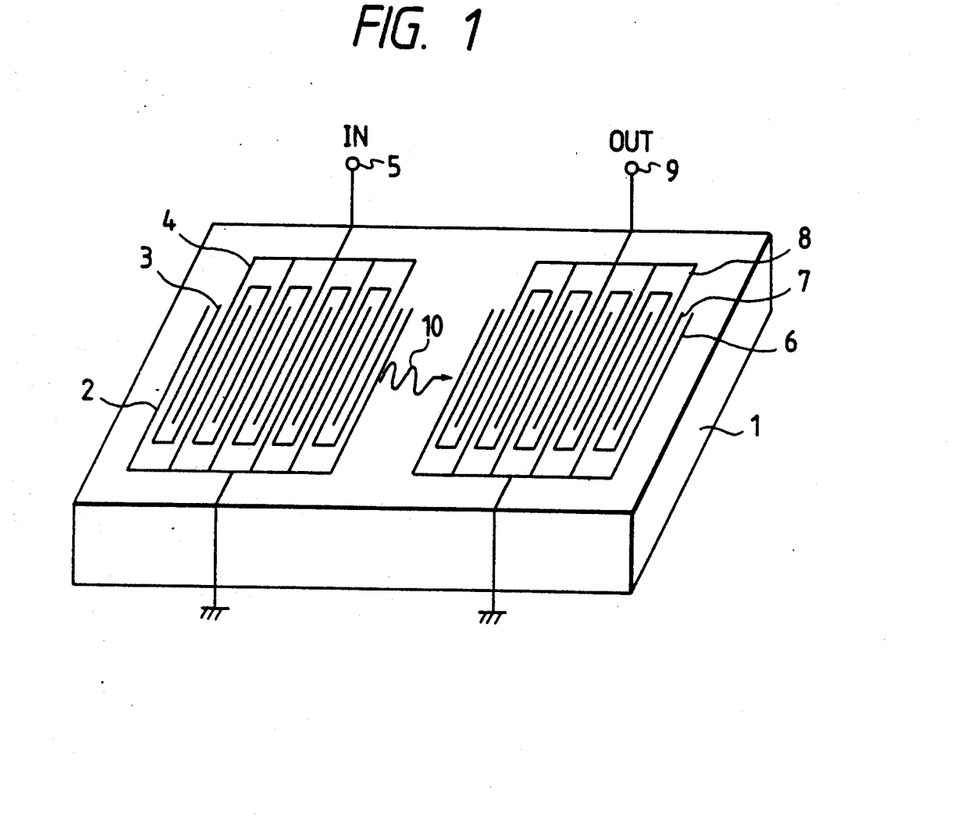
FIG. 1 is a perspective view of the first embodiment of the present invention.

FIG. 1 shows a surface acoustic wave device of the first embodiment of the present invention. The surface acoustic wave device of the first embodiment comprises an input transducer for converting an electric signal to a surface acoustic wave and an output transducer for converting a surface acoustic wave to an electric signal basically in the same way as a surface acoustic wave device of the prior art. The electrical characteristics of the surface acoustic wave device of the first embodiment are basically the same as those of a surface acoustic wave device of the prior art. There exists only one difference between the surface acoustic wave device of the first embodiment and a surface acoustic wave device of the prior art which is the electrode configuration of each transducer. In FIG. 1, a reference numeral 1 designates a piezoelectric substrate. Reference numerals 2, 3 and 4 designate electrode fingers mounted on the piezoelectric substrate 1 for forming an input transducer. Reference numerals 6, 7 and 8 designate electrode fingers mounted on the piezoelectric substrate 1 for forming an output transducer. Reference numerals 5 and 9 designate an input terminal and an output terminal of the surface acoustic wave device. A reference numeral 10 designates a surface acoustic wave which propagates from the input transducer to the output transducer. A positive or negative voltage is applied to the electrode fingers 2 and 4 of the input transducer as an input signal. The electrode finger 3 is located between the electrode fingers 2 and 4. The electrode finger 3 is not connected to an external circuit and is electrically independent of the external circuit. A positive or negative voltage is delivered out of the electrode fingers 6 and 8 of the output transducer as an output signal. The electrode finger 7 is located between the electrode fingers 6 and 8. The electrode finger 7 is not connected to an external circuit and is electrically independent of the external circuit.

Figure 2:
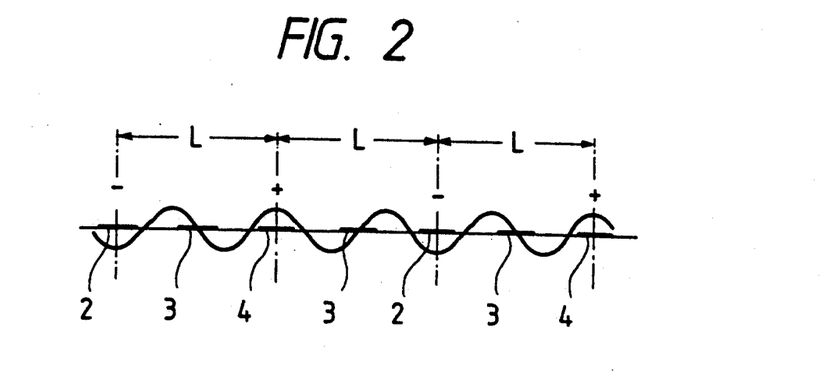
FIG. 2 is a sectional view of electrode fingers of the embodiment shown in FIG. 1 for explaining the layout of the electrode fingers.

FIG. 2 shows a sectional view of the input transducer of the surface acoustic wave device shown in FIG. 1. The distance between the centers of the electrode fingers 2 and 4 which are applied with a positive or negative voltage is assumed as L. A frequency of a surface acoustic wave excited by the voltages applied to the electrode fingers 2 and 4 is obtained from the expression indicated below.

$$L=(n+0.5)\lambda$$

where symbol n indicates zero or a positive integer and symbol $\lambda$ indicates a wavelength of a surface acoustic wave which can propagate through the piezoelectric substrate.

In the case of a surface acoustic wave device, the frequency of a surface acoustic wave can be represented by the center frequency (for example, the frequency at the center of the pass band of the surface acoustic wave filter) of the surface acoustic wave device. Assuming, therefore, a wavelength of the surface acoustic wave propagating through the piezoelectric substrate 1 at a frequency equivalent to the center frequency of the surface acoustic wave device as $\lambda_o$, the above expression can be represented as follows:

$$L=(n+0.5)\lambda_o$$

According to the present invention, a symbol n can be set to 1, 2, or 3. The reason will be described later. Since the electrode finger 3 is located between the electrode fingers 2 and 4 in the present invention, the location pitch of the electrode fingers 2, 3 and 4 is about $L/2=(n+0.5)\lambda_o/2$. The width of each of the electrode fingers 2, 3 and 4 in the present invention is about $L/4=(n+0.5)\lambda_o/4$.

FIG. 2 shows an embodiment in which a symbol n is set to 1. When n=1, the location pitch of the electrode fingers 2, 3 and 4 is about $1.5\lambda_o/2$, and the width of each of the electrode fingers 2, 3 and 4 is about $1.5\lambda_o/4$. The width of each of the electrode fingers of a surface acoustic wave device of the prior art is about $\lambda_o/4$. Since the width of each of the electrode fingers of the embodiment of the present invention shown in FIG. 2 is about $1.5\lambda_o/4$ and the space between the neighboring electrode fingers is also about $1.5\lambda_o/4$, the fineness required of the processing technic for electrode fingers is eased by 50%.

When n=0, the width of each of the electrode fingers is about $\lambda_o/8$ and the space between the neighboring electrode fingers is also about $\lambda_o/8$. Therefore, a very fine processing technic is required. From a processing technic viewpoint, it is desirable that the value of n is large, n=3 is a practical upper limit from a viewpoint of the excitation efficiency of a surface acoustic wave.

According to the present invention, therefore, a positive integer of 3 or smaller is selected as a value of n.

According to the present invention, both the width of each electrode finger and the space between the neighboring electrode fingers are equal to each other (i.e., $(n+0.5)\lambda_o/4$). This means the fineness of processing of the width of electrode fingers and the space between neighboring electrode fingers are the same. This is extremely desirable from a viewpoint of the processing technic.

Since the electrode fingers 3 of the embodiment of the present invention shown in FIG. 2 are not connected to the external circuit, the electrode fingers 3 are electrically floating. The potential of this floating electrode finger 3 is almost an intermediate of the voltages applied to the electrode fingers 2 and 4 on both sides. The installation of the floating electrode finger 3 between the changed electrode fingers 2 and 4 represents a novel feature of the present invention. As described later in detail, it is desirable that each of the floating electrode fingers are electrically connected to each other so as to provide the same potential.

In the embodiment shown in FIG. 1, the electrode fingers 6, 7 and 8 form the output transducer and are located on the piezoelectric substrate 1 at the same pitch as the electrode fingers 2, 3 and 4 of the input transducer. The width the electrode fingers 6, 7 and 8 is also the same as that of the electrode fingers 2, 3 and 4. The electrode finger 7 between the electrode fingers 6 and 8; which supply output voltages, is also a floating electrode finger like the electrode finger 3 of the input transducer. Similarly to the floating electrode fingers of the input transducer, it is desirable that each of the floating electrode fingers of the output transducer are electrically connected to each other so as to provide the same potential.

The transducer of the configuration shown in FIG. 2 can excite a surface acoustic wave in similar way as with the configuration shown in FIGS. 3(a) and 3(b) and will be described hereunder. It is necessary to consider an interval of L first. Although lines of electric force run from an electrode finger which is applied with a positive voltage to an electrode finger which is applied with a negative voltage, very few lines of electric force run directly from a positive electrode finger to a negative electrode finger. The oscillation field distribution of the surface acoustic wave shown in FIG. 2 oscillates by the distance equivalent to about 1.5 times of the wavelength within an interval of L. The above lines of electric force in this section run in a fixed direction predetermined by the relative position of the positive and negative electrode fingers. Very few directly running electric force lines are coupled to the oscillation field distribution of the surface acoustic wave via the piezoelectric effect of the substrate 1. Since few lines of electric force run directly between the positive and negative electrode fingers and few lines of electric force directly running are coupled to the surface acoustic wave, excitation of the surface acoustic wave by the lines of electric force directly running between the positive and negative electrode fingers can be ignored.

Lines of electric force, which run from the positive electrode finger to the intermediate floating electrode finger and then from the floating electrode finger to the negative electrode finger exist. The above lines of electric force between the positive and floating electrode fingers are, as shown in FIG. 2, synchronized with the period of the oscillation field distribution of the surface acoustic wave in similar way as the lines of electric force running from the positive electrode finger to the negative electrode finger shown in FIG. 3(b). The lines of electric force running from the floating electrode finger to the negative electrode finger are also synchronized with the period of the oscillation field distribution of the surface acoustic wave. Therefore, the lines of electric force, which run from the positive electrode finger to the intermediate floating electrode finger and then from the floating electrode finger to the negative electrode finger, are intensely coupled to the surface acoustic wave via the piezoelectric effect of the substrate. It has been recorded that the coupling intensity is almost equal to that when electrode fingers with the width of about a quarter of the wavelength shown in FIGS. 3(a) and 3(b) are used. The foregoing is the configuration of the first embodiment of the present invention. Assuming that a wavelength of a surface acoustic wave, which can propagate at a frequency equivalent to the center frequency of a surface acoustic wave device, is $\lambda_0$, by setting the width of electrode fingers, which are applied with positive and negative voltages, to about $1.5\lambda_0/4$ and installing electrically floating electrode fingers with a width of about $1.5\lambda_0/4$ between the electrode fingers, a surface acoustic wave device, which provides a function almost equal to that of a surface acoustic wave device of the prior art with a configuration of electrode fingers with a width of about $\lambda_0/4$ and which eases the processing load required for forming electrode fingers to two thirds of the load required for forming the conventional electrode fingers, can be provided.

Figure 4A:
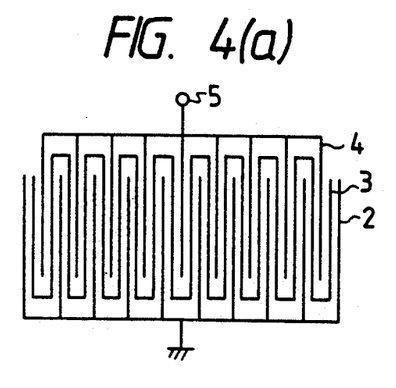
FIGS. 4(a), 4(b) and 4(c) are plan views for showing the layout of electrode fingers of the second, third, and fourth embodiments of the present invention.
Figure 4B:
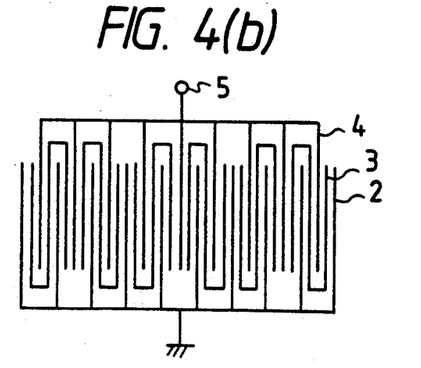
Figure 4C:
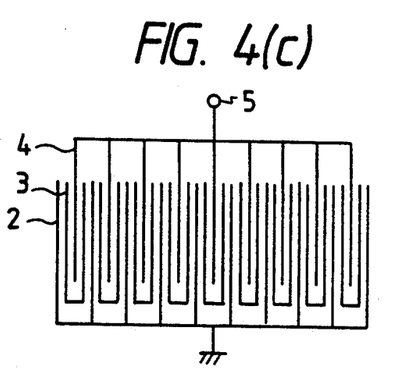

Next, the second, third, and fourth embodiments of the present invention will be described according to the present invention. FIGS. 4(a), 4(b) and 4(c) show various configuration examples of transducers according to the present invention. FIG. 4(a) shows a transducer with a configuration which is the same as that of the transducer shown in FIG. 1 or 2.

It is desirable that the electrically floating electrode fingers 3 are all electrically connected to each other as shown in FIG. 4(a). By doing this, the excitation of the surface acoustic wave described in FIG. 2 will not be affected greatly. The excited surface acoustic wave propagates horizontally, though the surface acoustic wave is converted to a bulk wave or scattered by an effect of the electrically floating finger during propagation, increasing losses. Various experiments show that the losses can be greatly decreased by electrically connecting the electrically floating electrode fingers 3 to each other as shown in FIG. 4(a). Possible causes are as follows.

When a surface acoustic wave propagates through a piezoelectric substrate, the concentration of the surface acoustic wave energy on the substrate varies with the status of the propagation path surface whether or not the surface is deposited with a thin metallic film. The energy concentration on the substrate surface coated with a thin metallic film is high. This means that the substrate surface created with a thin metallic film prevents the substrate surface from disturbance and minimizes conversion of the surface acoustic wave to a bulk wave. The same may be said with FIG. 4(a). When an electrically floating electrode finger is fully independent of other floating electrode fingers, the floating electrode finger produces little effect on the energy concentration of a surface acoustic wave during propagation on the substrate surface. When an electrode finger is on the substrate surface, therefore, the surface is greatly disturbed and the surface acoustic wave is converted to a bulk wave during propagation, resulting in an increase in losses.

When the electrically floating electrode fingers are electrically connected to each other as shown in FIG. 4(a), the excitation of the surface acoustic wave, as described above, is not different from that when the floating electrode fingers are not electrically connected to each other. The propagation of the excited surface acoustic wave takes place in a state very close to the state when the propagation path of the surface acoustic wave, i.e., the substrate surface is coated with a thin metallic film. Therefore, the conversion of the surface acoustic wave to a bulk wave, which is caused by the disturbance of the substrate surface where electrode fingers exist, is extremely minimized, resulting in a great decrease in the loss by conversion.

This is the reason why the electrically floating electrode fingers are electrically connected to each other as shown in FIG. 4(a). However, it is not always advisable, in consideration of the yield rate of forming of devices, to electrically connect all floating electrode fingers. Various experiments show that partial connections between several floating electrode fingers as shown in FIGS. 4(b) and 4(c) produce the same effect. The experiments show that connections of at least two floating electrode fingers to each other produce almost the same loss characteristics as those in FIG. 4(a).

When creating frequency characteristics of a surface acoustic wave device or filter, it is necessary to weight the transducers. A weighting example of a transducer comprising electrode fingers with the configuration shown in FIG. 4(a) (see introduction of "New Phase Weighting" indicated in IEEE Transactions on Microwave Theory and Techniques, Vol. MTT-33, No. 6, pp. 510-518, June 1985) will be described hereunder.

Figure 5:
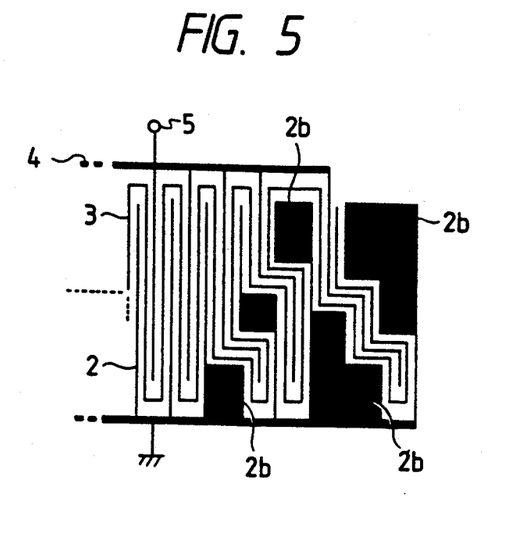
FIG. 5 is a plan view for showing the layout of electrode fingers of the fifth embodiment of the present invention.

FIG. 5 represents the fifth embodiment of the present invention which is a transducer comprising electrode fingers with the configuration similar to that shown in FIG. 4 (a), which is subject to "New Phase Weighting". It is important that when a transducer is weighted, broad electrodes 2b, which are not directly related to the excitation of a surface acoustic wave or similar portions, are formed as shown in FIG. 5. The transducer, the back of the piezoelectric substrate and the substrate act as a capacitor. This capacitor adversely affects high frequency characteristics of the surface acoustic wave device. To minimize this effect of the earth capacitor, it is desirable to form broad electrodes 2b with a large area on the ground side of the transducer as shown in FIG. 5. By doing this, a device which is not affected by the earth capacitor of the broad electrodes 2b can be produced.

Figure 6:
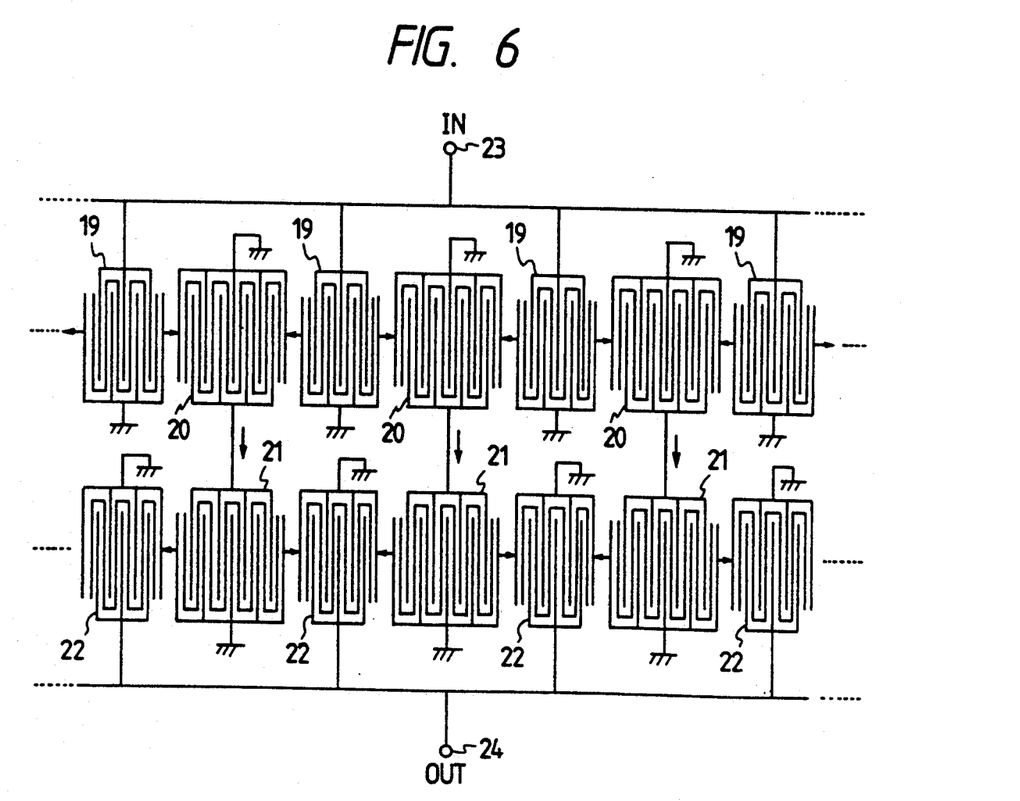
FIG. 6 is a plan view for showing the layout of electrode fingers of a surface acoustic wave filter of the sixth embodiment of the present invention.

A transducer with the electrode finger configuration like that shown in FIG. 4(a) is applied, as shown in FIG. 6, to image impedance connection transducers 20 and 21 of a low-loss surface acoustic wave filter using image impedance connection transducers described in the previous literature, and also to input and output transducers 19 and 22. FIG. 6 shows a filter of the sixth embodiment of the present invention.

Figure 7:
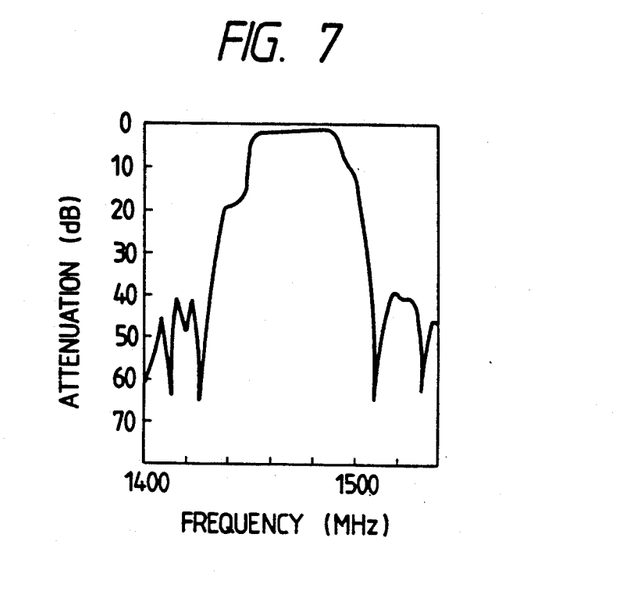
FIG. 7 is a graph for showing the frequency characteristics of the filter shown in FIG. 6.

FIG. 7 shows the response of the filter configuration shown in FIG. 6 when the filter is simulated in the 1.5 GHz frequency band by the simulation method indicated in the literature. The simulation result shows that the obtained filter frequency characteristics are almost the same as those obtained when the transducers comprise electrode fingers with a width of about a quarter of the wavelength, which are indicated in the literature, are used and that the electrode finger configuration of the present invention is extremely effective. Each arrow shown in FIG. 6 indicates the propagation direction of the surface acoustic wave or the flow direction of the electrical signal.

Connections between electrically floating electrode fingers as shown in FIG. 4(a) may greatly affect not only the loss characteristics but also the excitation efficiency of the surface acoustic wave since the propagation mode of a surface acoustic wave depends on the cut angle of the piezoelectric substrate. This will be described hereunder.

In the case of a lithium niobate (LiNbO3) piezoelectric substrate, for example, the cut angle of LiNbO3, which is generally used as a TV intermediate frequency surface acoustic wave filter, is 128° rotated Y-cut X-propagation. This surface acoustic wave is called a Rayleigh surface wave and is lower in propagation speed than bulk waves propagating in LiNbO3, i.e., a longitudinal wave and two transverse waves. When the crystal cut angle of LiNbO3 is changed, surface acoustic waves can be propagated in various modes depending on the rotational angle as indicated in Journal of Applied Physics, Vol. 43, No. 3, pp. 856–862, March 1972. The literature shows that a leaky surface wave can propagate along the X axis of a 41° or 64° rotated Y-cut plane in LiNbO3. This leaky surface wave's propagation speed is, unlike a Rayleigh surface wave, higher than that of the slowest bulk wave, i.e., the slow transverse wave in the bulk waves which propagate through LiNbO3. Such a surface acoustic wave can be efficiently converted from an electrical signal to an elastic oscillation because the electromechanical coupling factor of the wave is extremely high. The temperature characteristics of the leaky surface wave are better than those of the Rayleigh surface wave. Therefore, the lithium, niobate (LiNbO3) piezoelectric substrate is well suited as a piezoelectric substrate for current communication surface acoustic wave devices.

Figure 8A:
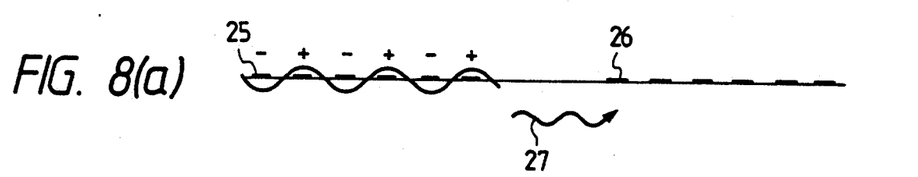
FIGS. 8(a), 8(b) and 8(c) are drawings for explaining the propagation status of a surface acoustic wave.
Figure 8B:
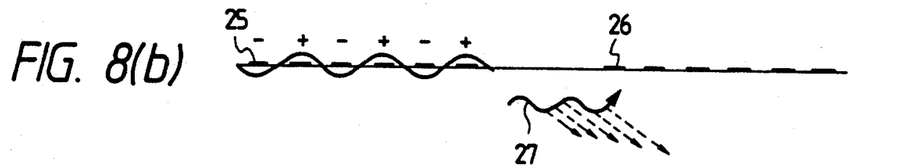
Figure 8C:
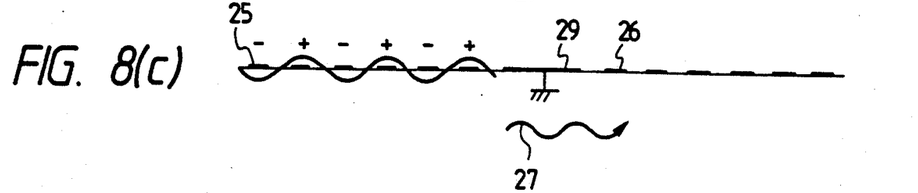

As described in the above literature, this leaky surface wave in the oscillation field distribution differs between the piezoelectric substrate surface with a thin metallic film coated and that without a thin metallic film. The leaky surface wave is compared in FIG. 8 with the Rayleigh surface wave.

FIG. 8(a) shows the propagation status of a Rayleigh surface wave; that is, a surface acoustic wave 27, which is excited by an input transducer 25, propagates on the surface of the substrate, and is received by an output transducer 26. There is no loss caused by propagation in principle on the propagation path from the input transducer to the output transducer. FIGS. 8(b) and 8(c) show the propagation statuses of the leaky surface wave. The leaky surface wave, which is excited by the input transducer 25, is propagated to the output transducer 26. When the propagation path between the transducers 25 and 26 is not coated with a thin metallic film, the propagation form of the leaky surface wave is close to that of a bulk wave, causing most of the energy to be discharged into the substrate, as shown in FIG. 8(b). When the substrate surface is coated with a thin metallic film 29, the energy discharge into the substrate is minimized and the loss caused by propagation is decreased to that of the Rayleigh surface wave, as shown in FIG. 8(a). Therefore, when forming devices using a leaky surface wave, it is necessary to use substrates with the surface coated with the thin metallic film 29 or substrates in a state similar to the coated state.

The above description shows that when a transducer with the electrode finger configuration of the present invention is formed with a substrate through which a leaky surface wave can propagate, electrical connections of the electrically floating electrode fingers shown in FIGS. 4(a), 4(b) and 4(c) to each provide a state equivalent to that when the substrate surface is coated with a thin metallic film.

As described above, a surface acoustic wave device of the prior art uses electrode fingers with a width of a quarter of the wavelength, and the processing difficulties are increased as the frequency increases. In comparison, while the electrode finger width according to the present invention is at least 1.5/4 times the wavelength and provides the same function while its processing difficulties can be greatly eased.

A transducer introducing the present invention can be weighted in the same way as a transducer of the prior art. For example, the filter structure of the prior art can be used unchanged.

The description of the embodiments of the present invention uses examples of surface acoustic wave filters. However, there are various surface acoustic wave devices available besides filters, such as a signal processing device and a device using an interaction of light and a surface acoustic wave. The present invention can obviously be applied to those devices.

We claim:

1. A surface acoustic wave device comprising:
   a piezoelectric substrate for propagating a surface acoustic wave; and
   a plurality of electrode fingers located on said substrate along the propagation of direction of said surface acoustic wave;
      wherein said plurality of electrode fingers are located on said substrate at a pitch of about $(n+0.5)\lambda_0/2$, and where the width of each of said plurality of electrode fingers is about $(n+0.5)\lambda_0/4$, where a symbol n indicates a positive integer not more than 3 and a symbol $\lambda_0$ indicates a wavelength of a surface acoustic wave with a frequency equivalent to the center frequency of said surface acoustic wave device,
      said plurality of plurality of electrode fingers are located on said substrate so that every other electrode finger is electrically independent of an external circuit, and
         wherein each neighboring pair or pairs of electrode fingers which are electrically independent of said external circuit are connected to each other so that the connected electrode fingers have the same potential.

2. A surface acoustic wave device according to claim 1 wherein each pair of neighboring electrode fingers, of the electrode fingers which are electrically independent of said external circuit, are alternately and electrically connected to two independent common electrodes, where a first independent common electrode is grounded and a second independent common electrode is connected to either an input terminal or an output terminal.

3. A surface acoustic wave device according to claim 2 wherein a part of the electric fingers connected to the grounded first independent common electrode are weighted by being formed as broad electrodes.

4. A surface acoustic wave device according to claim 2 wherein said piezoelectric substrate is cut from a piezoelectric crystal at such an angle that a leaky surface wave can propagate through the substrate.

5. A surface acoustic wave device according to claim 1 wherein a part of said plurality of electrode fingers are weighted.

6. A surface acoustic wave device according to claim 5 wherein said piezoelectric substrate is cut from a piezoelectric crystal at such an angle that a leaky surface wave can propagate through the substrate.

7. A surface acoustic wave device comprising:
an input transducer for converting an electrical signal to a surface acoustic wave;
a first intermediate transducer for converting a surface acoustic wave to an electrical signal;
a second intermediate transducer for converting an electrical signal to a surface acoustic wave, said second intermediate transducer being electrically connected to said first intermediate transducer; and,
an output transducer for converting a surface acoustic wave to an electrical signal;
wherein each of said transducers comprises a plurality of electrode fingers located on a piezoelectric substrate along the propagation direction of the surface acoustic wave,
wherein the plurality of electrode fingers of at least one of said transducers are located on said substrate at a pitch of about $(n+0.5)\lambda/2$, and where the width of each of said plurality of electrode fingers of said plurality of electrode fingers of said at least one of said transducers is about $(n+0.5)\lambda°/4$, where a symbol n indicates a positive integer not more than 3 and a symbol $\lambda o$ indicates a wavelength of a surface acoustic wave with a frequency equivalent to the center frequency of said surface acoustic wave device,
said plurality of electrode fingers of at least one said transducers are located on said substrate so that every other electrode finger is electrically independent of an external circuit, and
wherein each pair of neighboring electrode fingers, of the electrode fingers which are electrically independent of said external circuit, are alternately and electrically connected to two independent common electrodes, where a first independent common electrode is grounded and a second independent common electrode is connected to either an input terminal or an output terminal.

8. A surface acoustic wave device according to claim 2 wherein each neighboring pair or pairs of electrode fingers which are electrically independent of said external circuit are connected to each other so that the connected electrode fingers have the same potential.

9. A surface acoustic wave device according to claim 1 wherein a part of said plurality of electrode fingers of said at least one of said transducers are weighted.

10. A surface acoustic wave device according to claim 9 wherein said piezoelectric substrate is cut from a piezoelectric crystal at such an angle that a leaky surface wave can propagate through the substrate.

11. A surface acoustic wave device according to claim 7 wherein a part of the electrode fingers connected to the grounded first independent common electrode are weighted by forming broad electrodes.

12. A surface acoustic wave device according to claim 7 wherein said piezoelectric substrate is cut from a piezoelectric crystal at such an angle that a leaky surface can propagate through the substrate.

13. A surface acoustic wave device according to claim 7 wherein said piezoelectric substrate is cut from a piezoelectric crystal at such an angle that a leaky surface wave can propagate through the substrate.

14. A surface acoustic wave device comprising:
a piezoelectric substrate for propagating a surface acoustic wave; and
a plurality of electrode fingers located on said substrate along the propagation direction of said surface acoustic wave;
wherein said plurality of electrode fingers are located on said substrate at a pitch of about $1.5\lambda o/2$, and where the width of each of said plurality of electrode fingers is about $1.5\lambda°/4$, wherein a symbol $\lambda o$ indicates a wavelength of a surface acoustic wave with a frequency equivalent to the center frequency of said surface acoustic wave device,
said plurality of electrode fingers are located on said substrate so that every other electrode finger is electrically independent of an external circuit, and
wherein each pair of neighboring electrode fingers, of the electrode fingers which are electrically independent of said external circuit, are alternately and electrically connected to two common independent electrodes, where a first independent common electrode is grounded and a second independent common electrode is connected to either an input terminal or an output terminal.

15. A surface acoustic wave device according to claim 14 wherein each neighboring pair or pairs of electrode fingers which are electrically independent of said external circuit are connected to each other so that the connected electrode fingers have the same potential.

16. A surface acoustic wave device according to claim 14 wherein a part of said plurality of electrode fingers are weighted.

17. A surface acoustic wave device according to claim 16 wherein said piezoelectric substrate is cut from a piezoelectric crystal at such an angle that a leaky surface wave can propagate through the substrate.

18. A surface acoustic wave device according to claim 14 wherein a part of the electrode fingers connected to the grounded first independent common electrode are weighted by forming broad electrodes.

19. A surface acoustic wave device according to claim 14 wherein said piezoelectric substrate is cut from a piezoelectric crystal at such an angle that a leaky surface wave can propagate through the substrate.

20. A surface acoustic wave device according to claim 14 wherein said piezoelectric substrate is cut from a piezoelectric crystal at such an angle that a leaky surface wave can propagate through the substrate.

21. A surface acoustic wave device comprising:
an input transducer for converting an electrical signal to a surface acoustic wave;
a first intermediate transducer for converting a surface acoustic wave to an electrical signal;
a second intermediate transducer for converting an electrical signal to a surface acoustic wave, said second intermediate transducer being electrically connected to said first intermediate transducer; and, an output transducer for converting a surface acoustic wave to an electrical signal, wherein each of said transducers comprises a plurality of electrode fingers located on a piezoelectric substrate along the propagation direction of the surface acoustic wave, wherein the plurality of electrode fingers of at least one of said transducers are located on said substrate at a pitch of about $1.5\lambda/2$, and where the width of each of said plurality of electrode of said at least one of said transducers is about $1.5\lambda_o/4$, where a symbol $\lambda_o$ indicates a wavelength of a surface acoustic wave with a frequency equivalent to the center frequency of said surface acoustic wave device, said plurality of electrode fingers of said at least one of said transducers are located on said substrate so that every other electrode finger is electrically independent of an external circuit, and wherein each pair of neighboring electrode fingers, of the electrode fingers which are electrically independent of said external circuit, are alternately and electrically connected to two independent common electrodes, where a first independent common electrode is grounded and a second independent common electrode is connected to either an input terminal or an output terminal.

22. A surface acoustic wave device according to claim 21 wherein each neighboring pair or pairs of electrode fingers which are electrically independent of said external circuit are connected to each other so that the connected electrode fingers have the same potential.

23. A surface acoustic wave device according to claim 21 wherein a part of said plurality of electrode fingers of said at least one of said transducers are weighted.

24. A surface acoustic wave device according to claim 23 wherein said piezoelectric substrate is cut from a piezoelectric crystal at such an angle that a leaky surface wave can propagate through the substrate.

25. A surface acoustic wave device according to claim 21 wherein a part of the electric fingers connected to the grounded common electrode are weighted by forming broad electrodes.

26. A surface acoustic wave according to claim 21 wherein said piezoelectric substrate is cut from a piezoelectric crystal at such an angle that a leaky surface wave can propagate through the substrate.

* * * * *

UNITED STATES PATENT AND TRADEMARK OFFICE
CERTIFICATE OF CORRECTION

PATENT NO. : 5,235,234
DATED : August 10, 1993
INVENTOR(S) : Mitsutaka Hikita, et al.

It is certified that error appears in the above-indentified patent and that said Letters Patent is hereby corrected as shown below:

Claim 1, column 8, line 46, delete the second occurrence of "plurality of".

Claim 3, column 8, line 65, delete "electric" and substitute therefor --electrode--.

Claim 7, column 9, line 34, delete "$(n + 0.5)\lambda°/4$" and substitute therefor --$(n + 0.5)\lambda o/4$--.

Claim 7, column 9, line 40, before "said" insert --of--.

Claim 12, column 10, line 4, after "surface" insert --wave--.

Claim 14, column 10, line 18, delete "$1.5\lambda°/4$" and substitute therefor --$1.5\lambda o/4$--.

Signed and Sealed this

Eighth Day of March, 1994

Attest:

BRUCE LEHMAN

*Attesting Officer*  *Commissioner of Patents and Trademarks*